(12) United States Patent
Randhawa

(10) Patent No.: US 6,265,914 B1
(45) Date of Patent: Jul. 24, 2001

(54) PREDRIVER FOR HIGH FREQUENCY DATA TRANSCEIVER

(75) Inventor: Parminderjit Randhawa, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/444,424

(22) Filed: Nov. 19, 1999

(51) Int. Cl.[7] .................................................. H03B 1/00
(52) U.S. Cl. ........................ 327/108; 327/112; 327/374; 327/377; 326/82; 326/87
(58) Field of Search .................... 326/82, 86, 87; 327/403, 404, 407, 408, 409, 410, 374, 377, 392, 108, 109, 110, 111, 112

(56) References Cited

U.S. PATENT DOCUMENTS

| 4,777,389 | * | 10/1988 | Wu et al. | 326/28 |
| 5,168,176 | * | 12/1992 | Wanlass | 326/87 |
| 5,206,545 | * | 4/1993 | Huang | 326/87 |
| 5,306,965 | * | 4/1994 | Asprey | 327/108 |
| 5,362,997 | * | 11/1994 | Bloker | 327/108 |
| 5,410,189 | * | 4/1995 | Nguyen | 327/170 |
| 5,410,262 | * | 4/1995 | Kang | 327/108 |
| 5,898,326 | * | 4/1999 | Okayasu | 327/112 |
| 5,963,047 | * | 10/1999 | Kwong et al. | 326/87 |

OTHER PUBLICATIONS

National Semiconductor Product Data Sheet LM3460, "Precision Controller for GTLp and GTL Bus Termination," Oct. 21, 1999. http://www.national.com/pf/LM/LM3460.html.

Faichild Semiconductor Product Data Sheet GTLP8T306, "8–Bit LVTTL–to–GTLP Bus Transceiver", Oct. 21 1999. http://www.fairchildsemi.com/pf/GT/GTLP8T306.html.

Texas Instruments Product Data Sheet, "Digital Logic Technology Families: GTL Gunning Transceiver Logic", May 16, 1999, pp 1–3 http://www.ti.com/sc/docs/products/logic/families/gtl.htm.

Intel AP–827 Application Note, 100 MHz GTL+ Layout Guidelines for the Pentium® II Processor and Intel 440BX AGPset, May 12, 1999, 6–15. http://developer.intel.com/design/PentiumII/applnots/24373501.pdf.

* cited by examiner

Primary Examiner—Timothy P. Callahan
Assistant Examiner—An T. Luu

(57) ABSTRACT

A predriver for driving an output data buffer at high frequencies includes a data input, a data output, a first voltage pull-up circuit, a first voltage pull-down circuit, a delay circuit and a second voltage pull-down circuit. The first voltage pull-up circuit is coupled to the data output and has a control terminal coupled to the data input. The first voltage pull-down circuit is coupled to the data output and has a control terminal coupled to the data input. The first voltage pull-down circuit, when active, is adapted to at least temporarily hold the data output above a selected voltage. The delay circuit is coupled to the data input. The second voltage pull-down circuit is coupled to the data output and has a control terminal coupled to an output of the delay circuit.

16 Claims, 15 Drawing Sheets

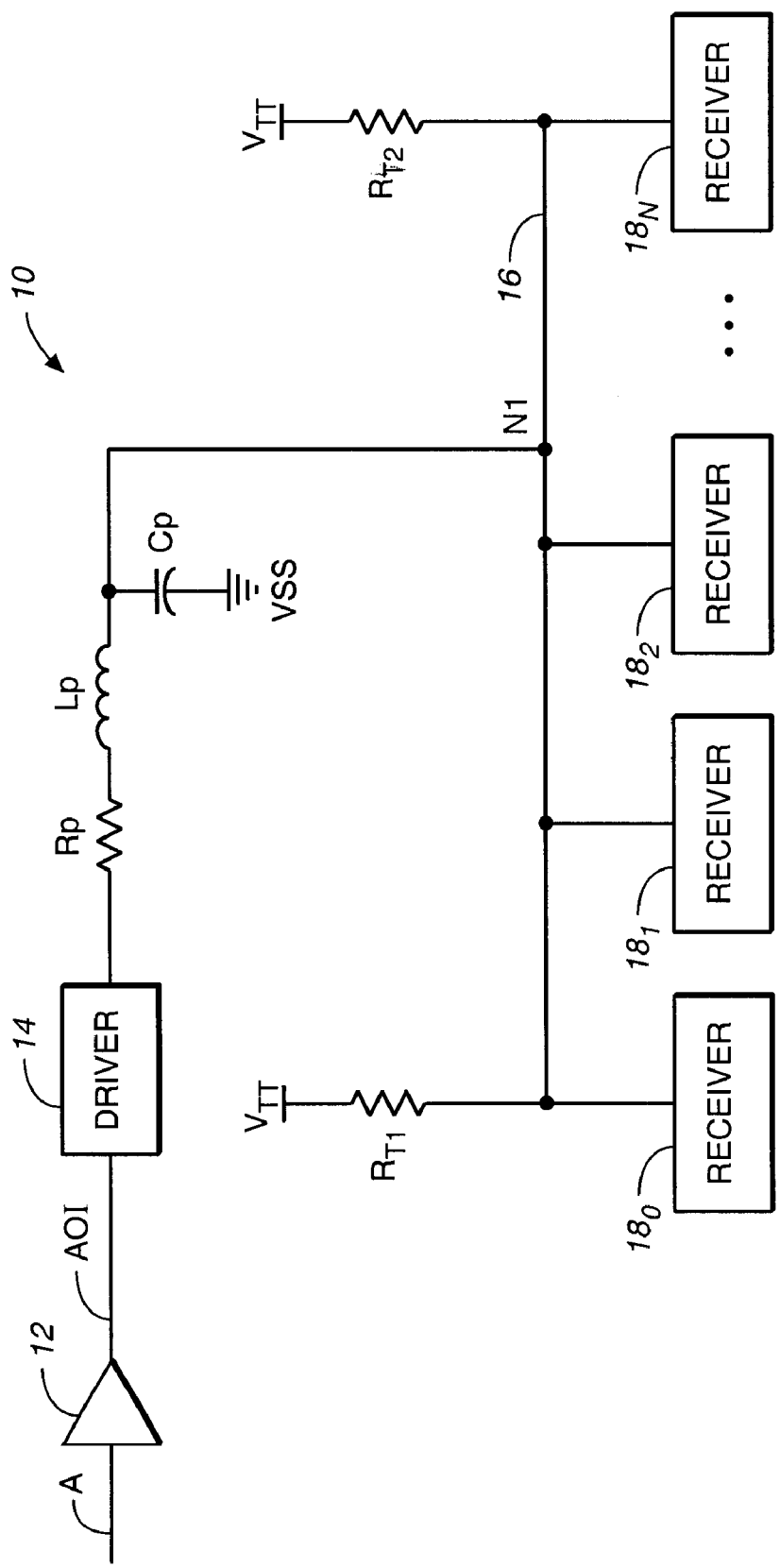
FIG._1

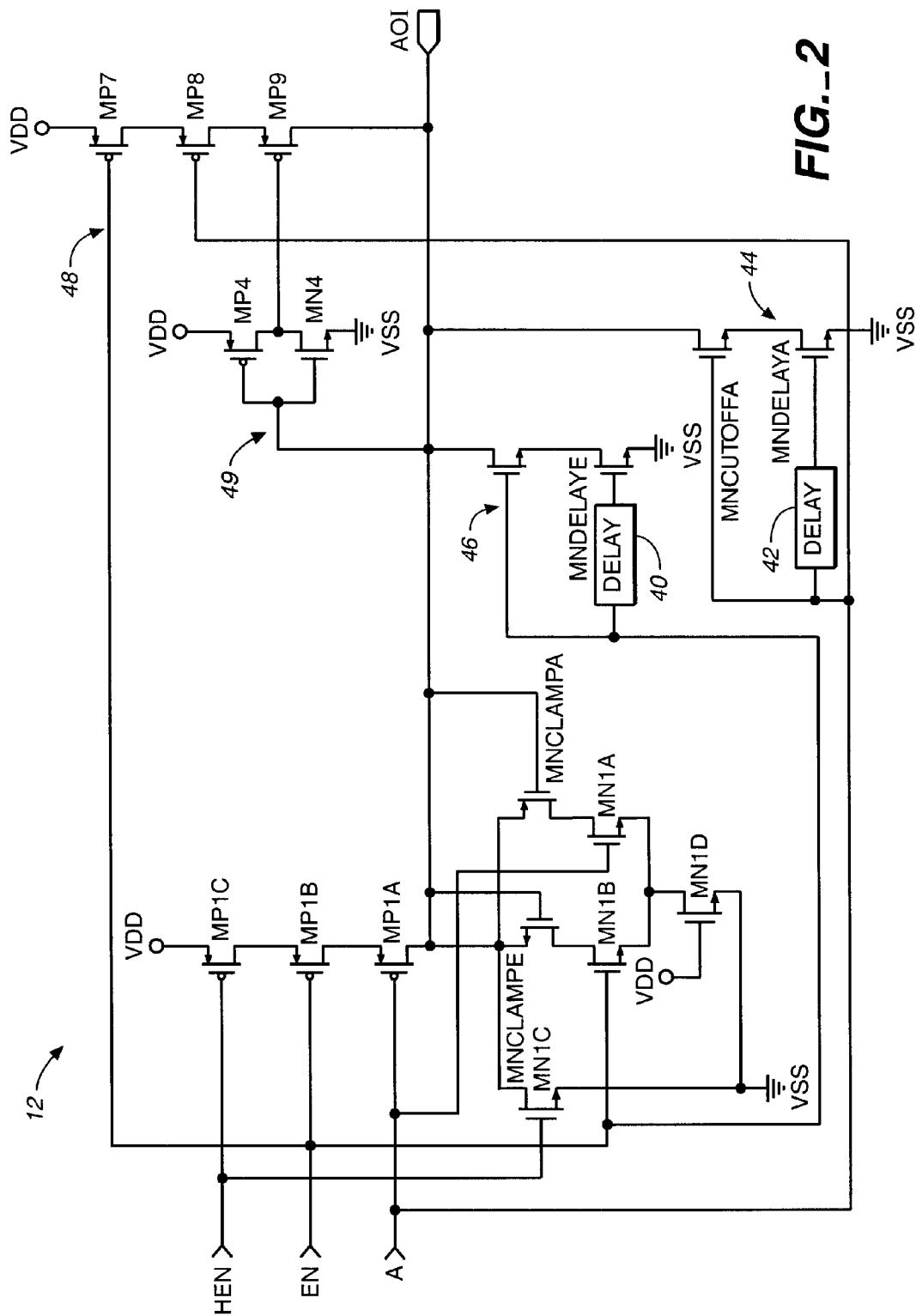
FIG._2

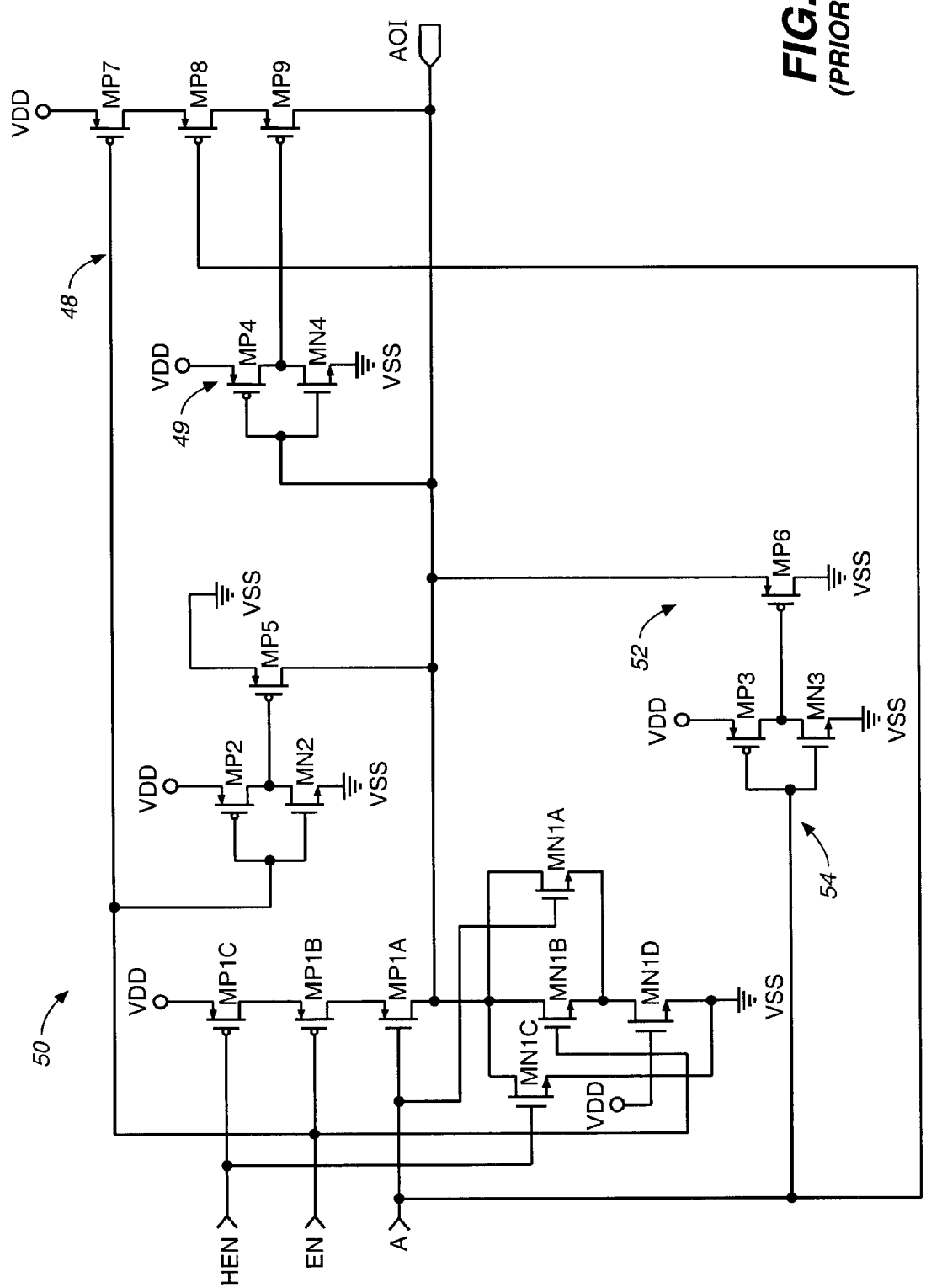
FIG._3 (PRIOR ART)

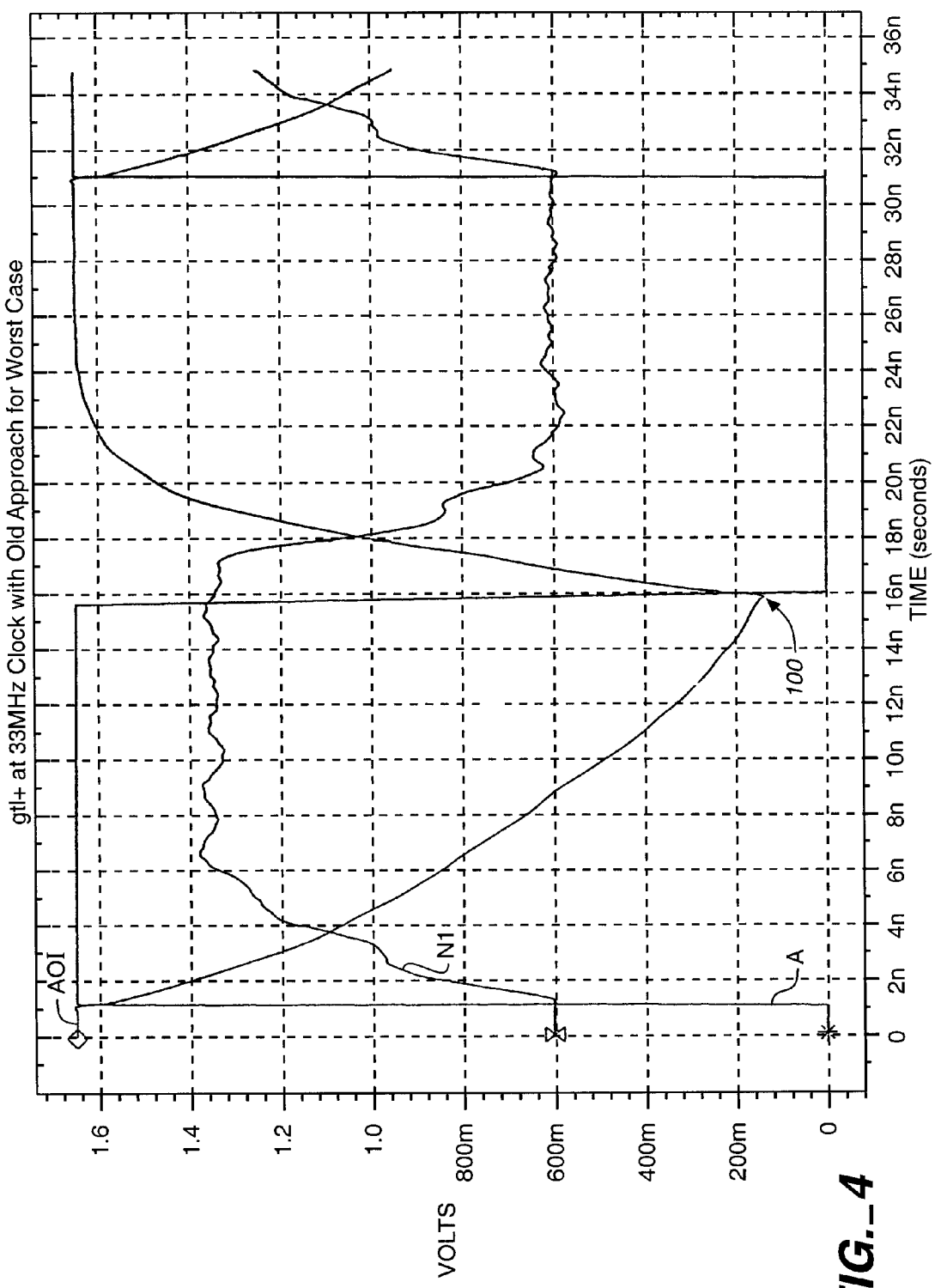
FIG._4

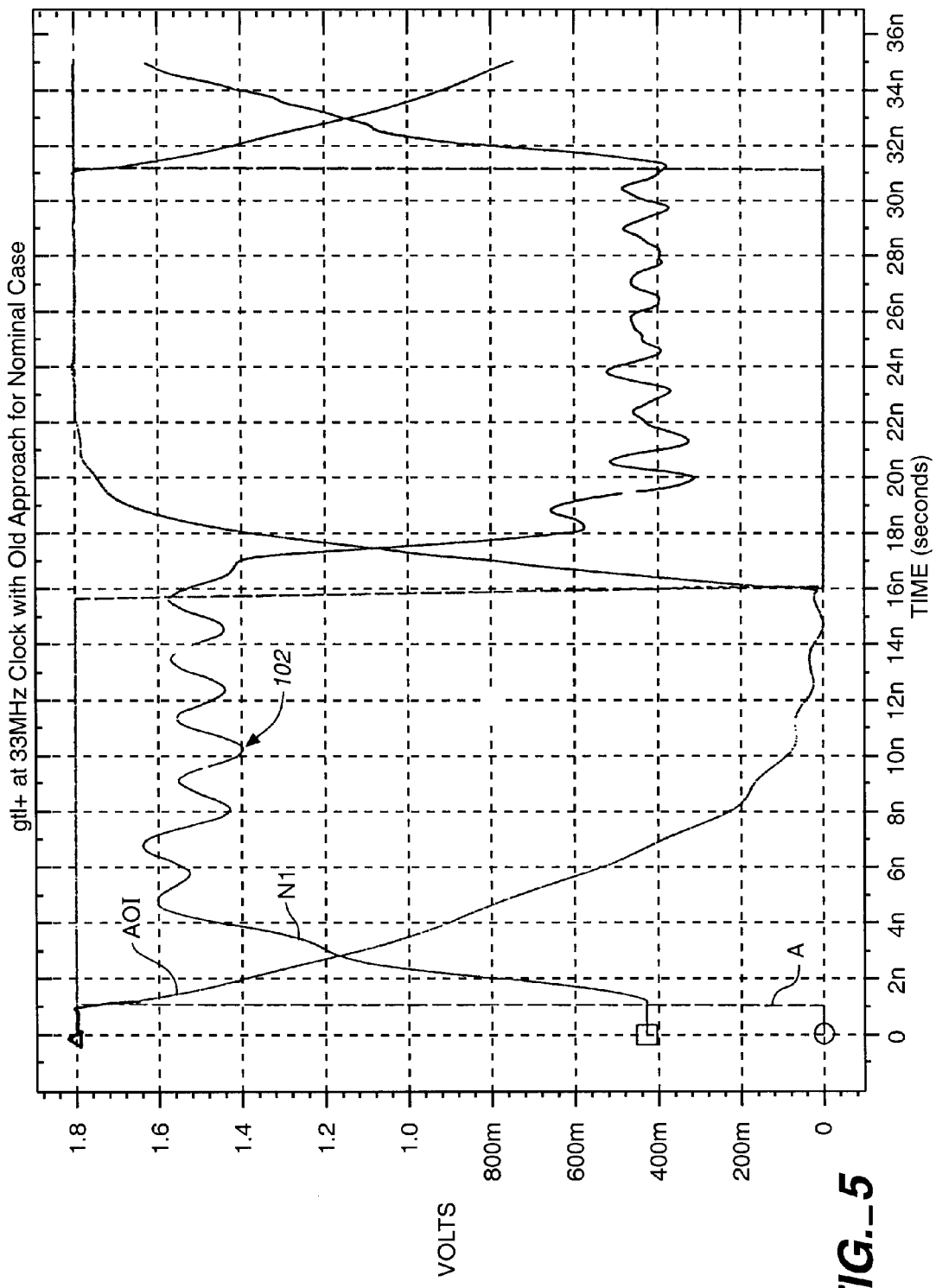
FIG._5

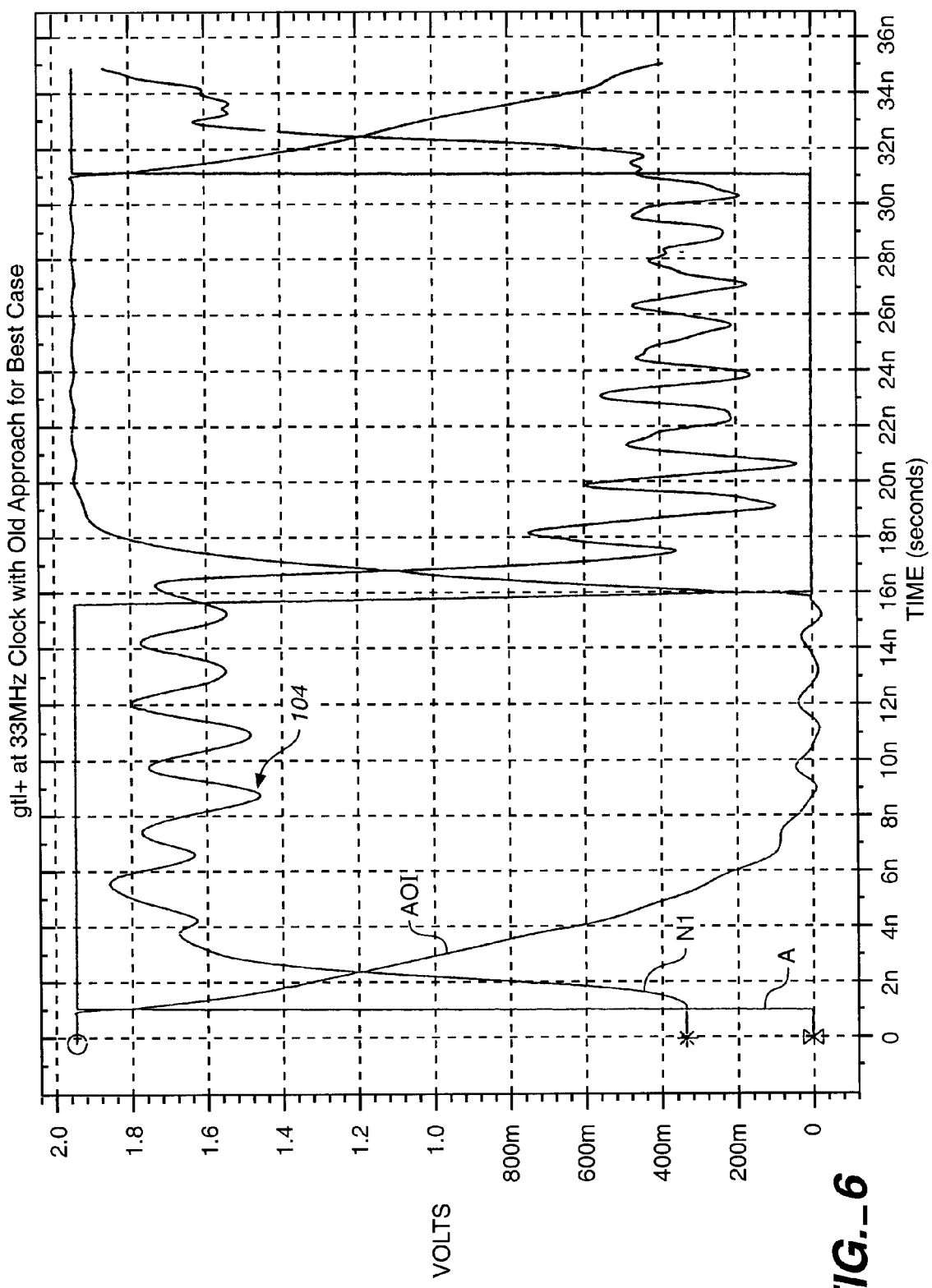
FIG._6

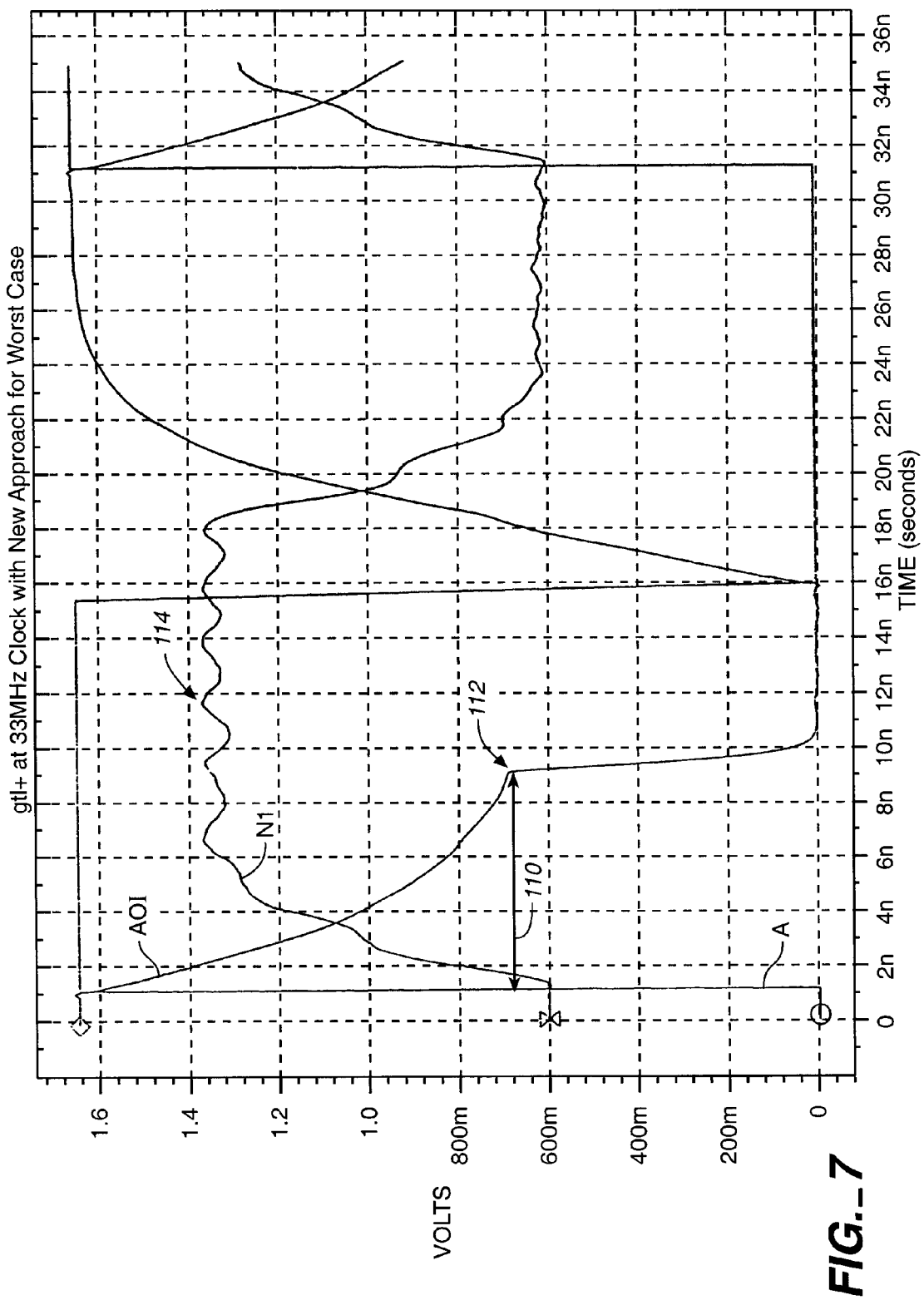
FIG._7

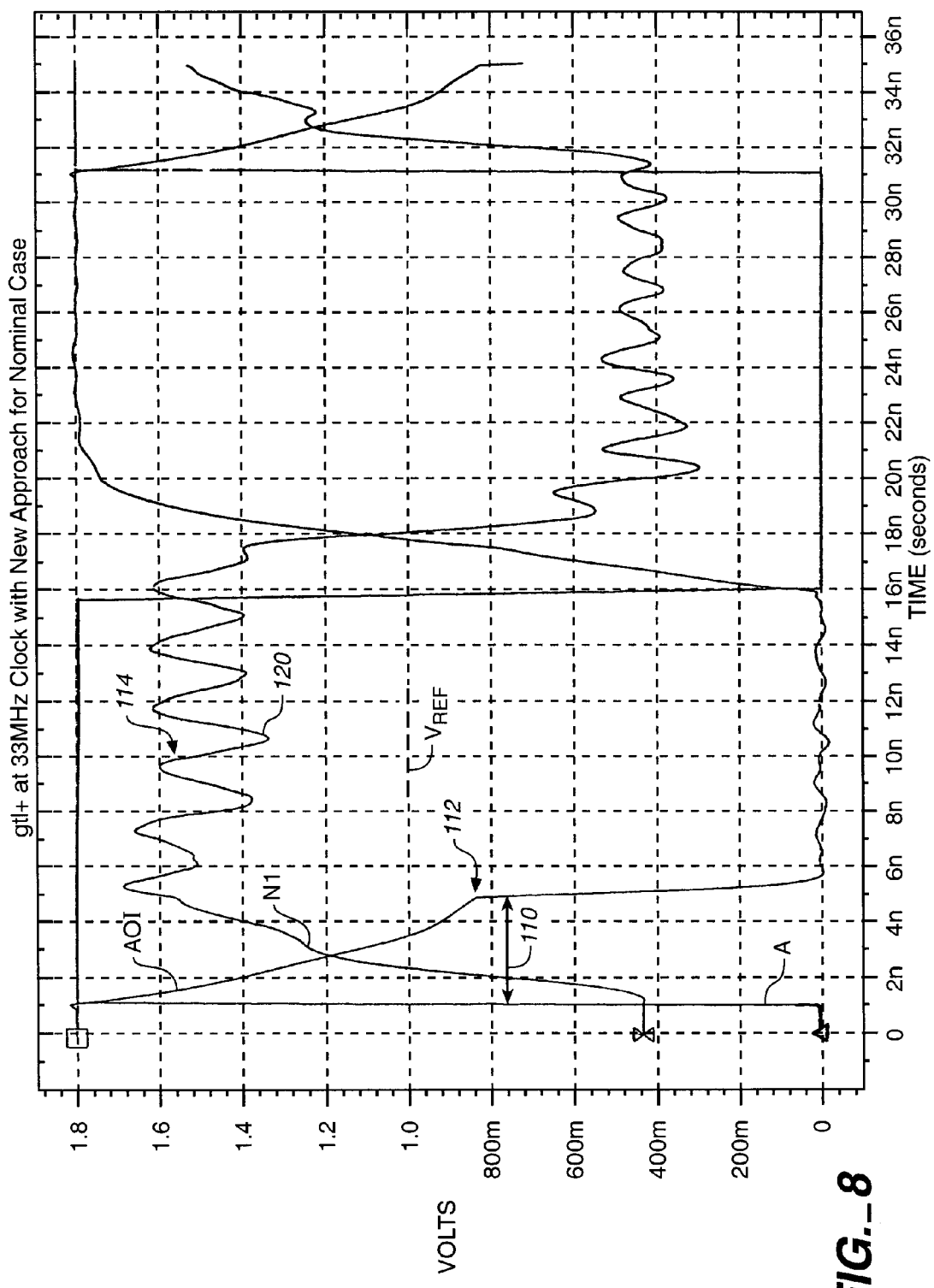
FIG._8

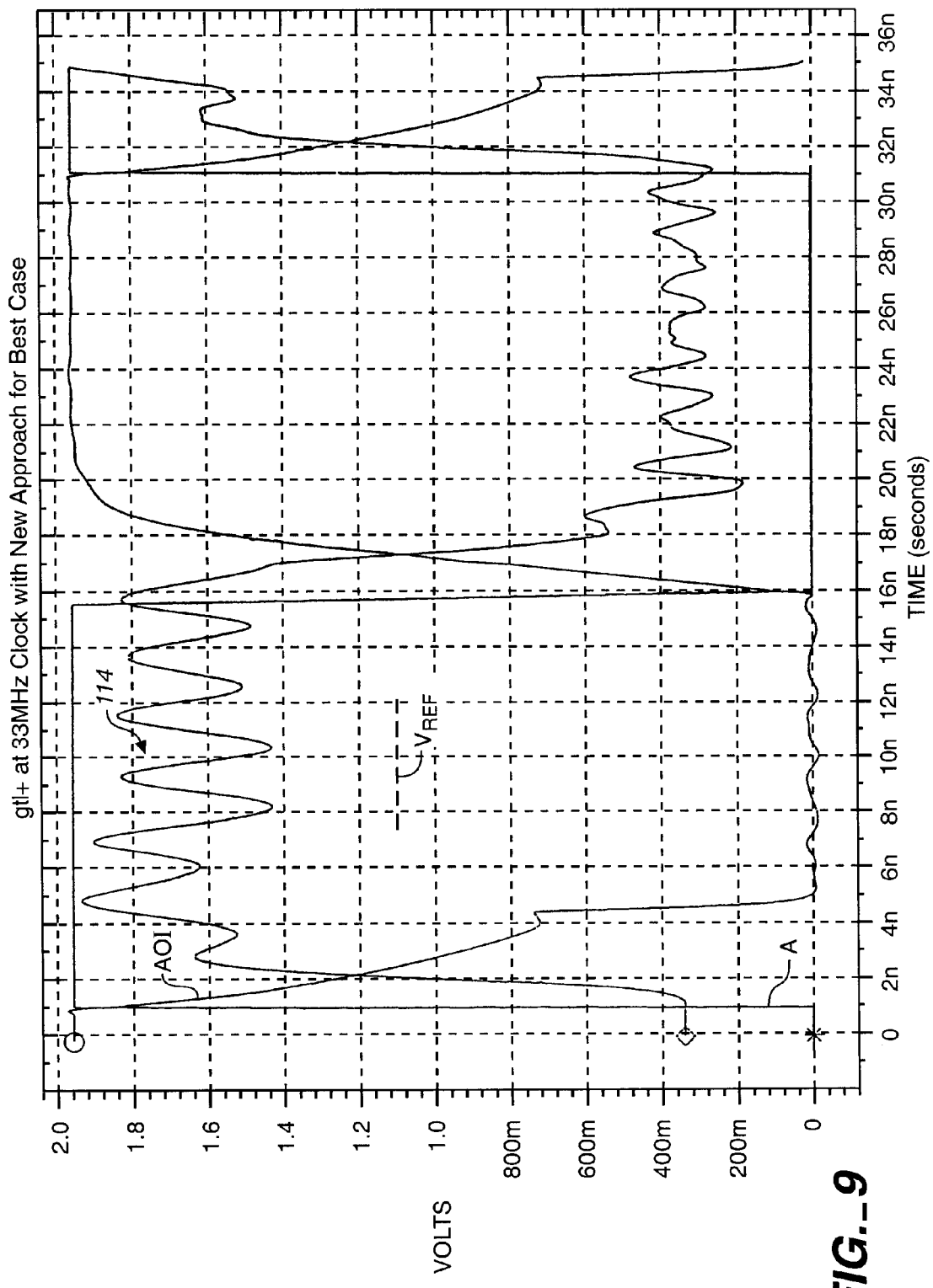
FIG._9

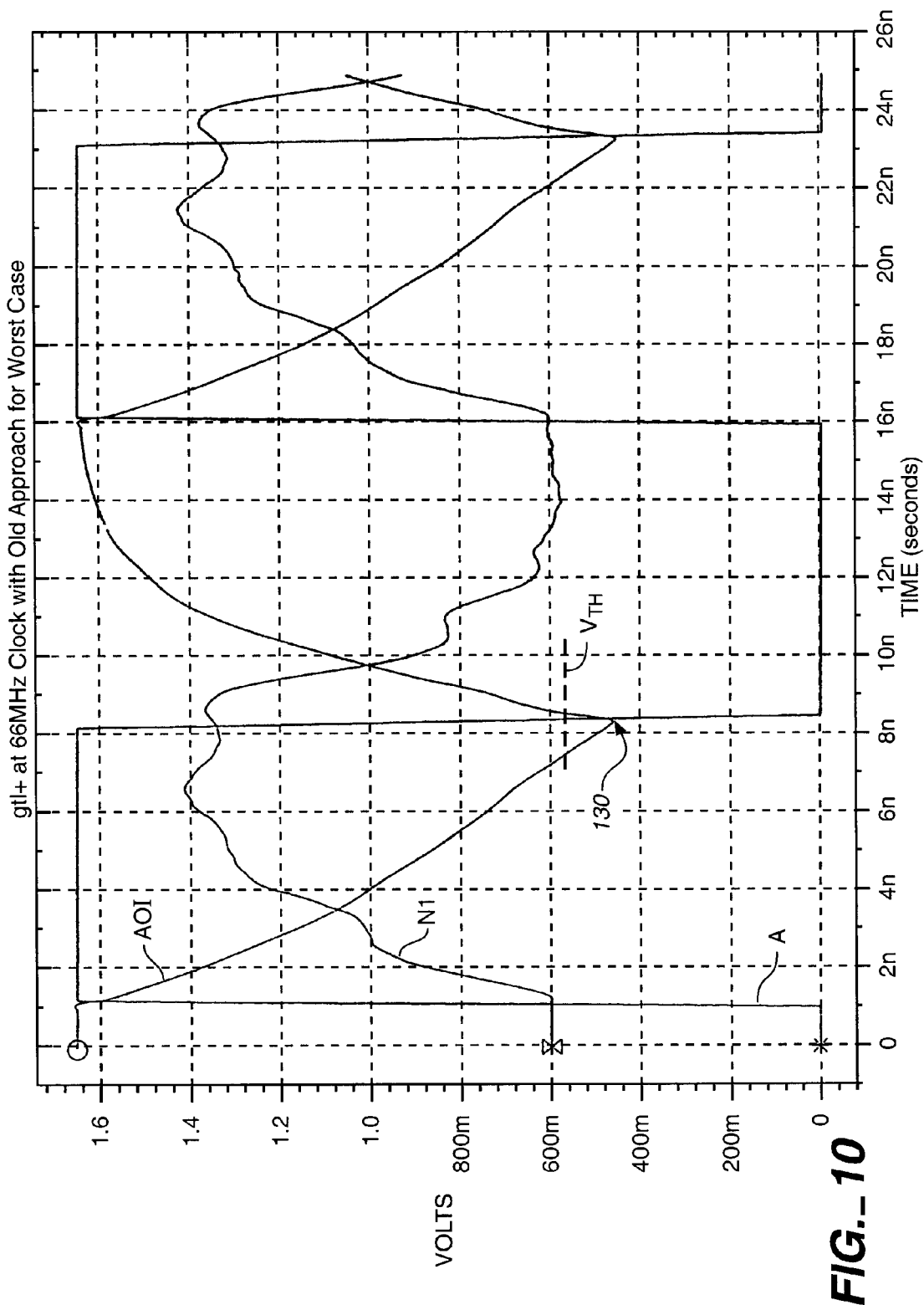
FIG._10

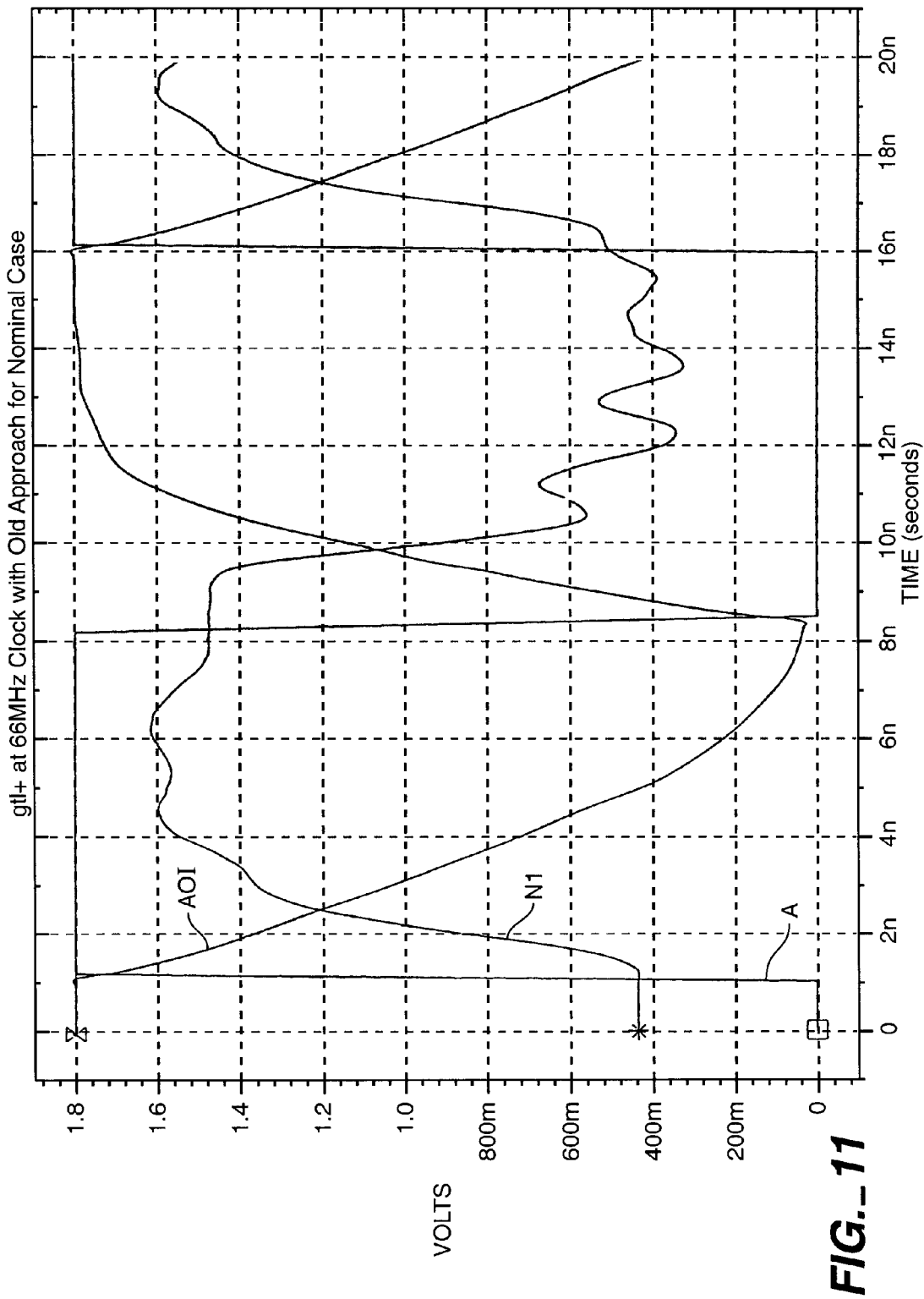
FIG._11

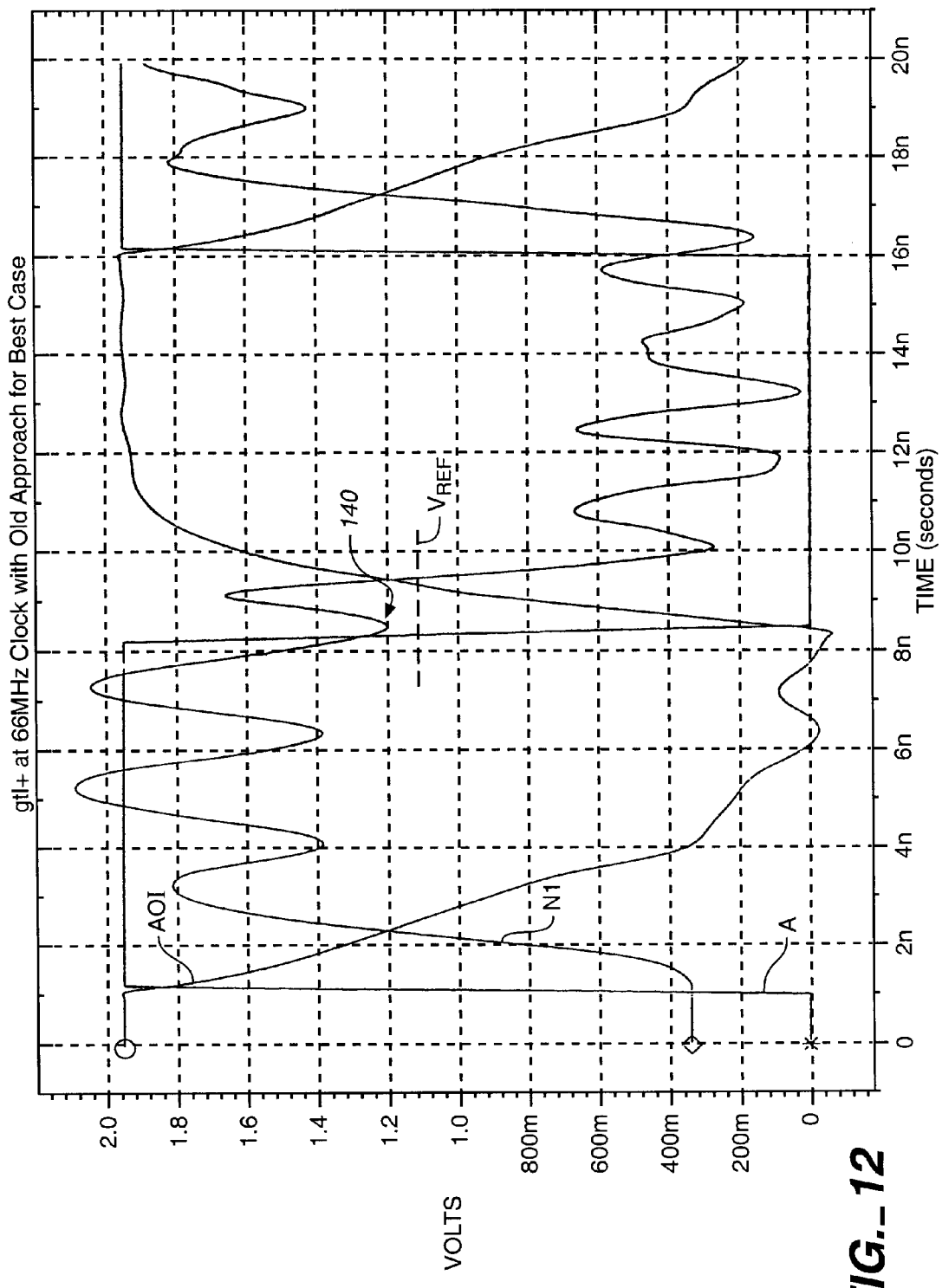
FIG._12

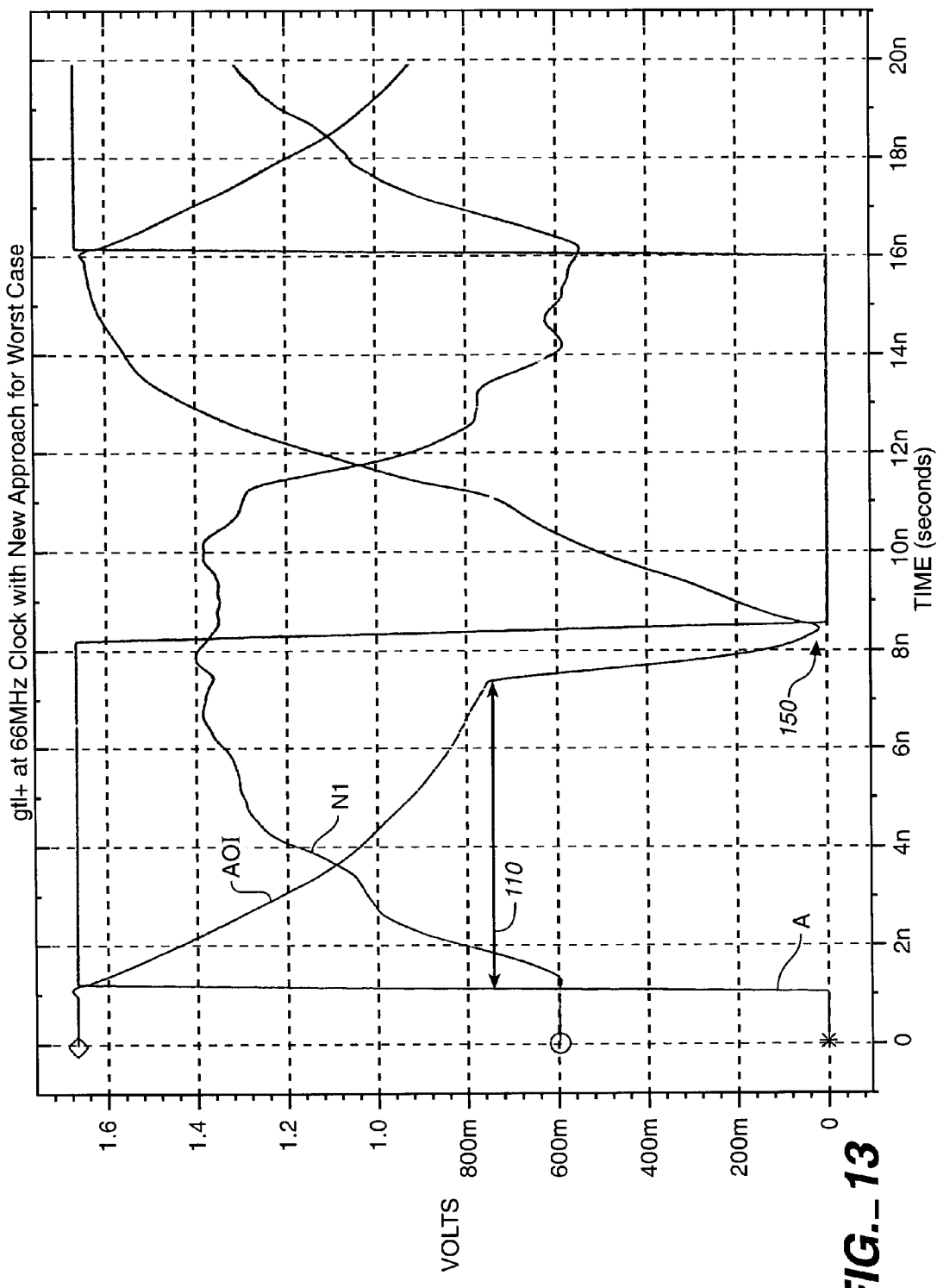
FIG._13

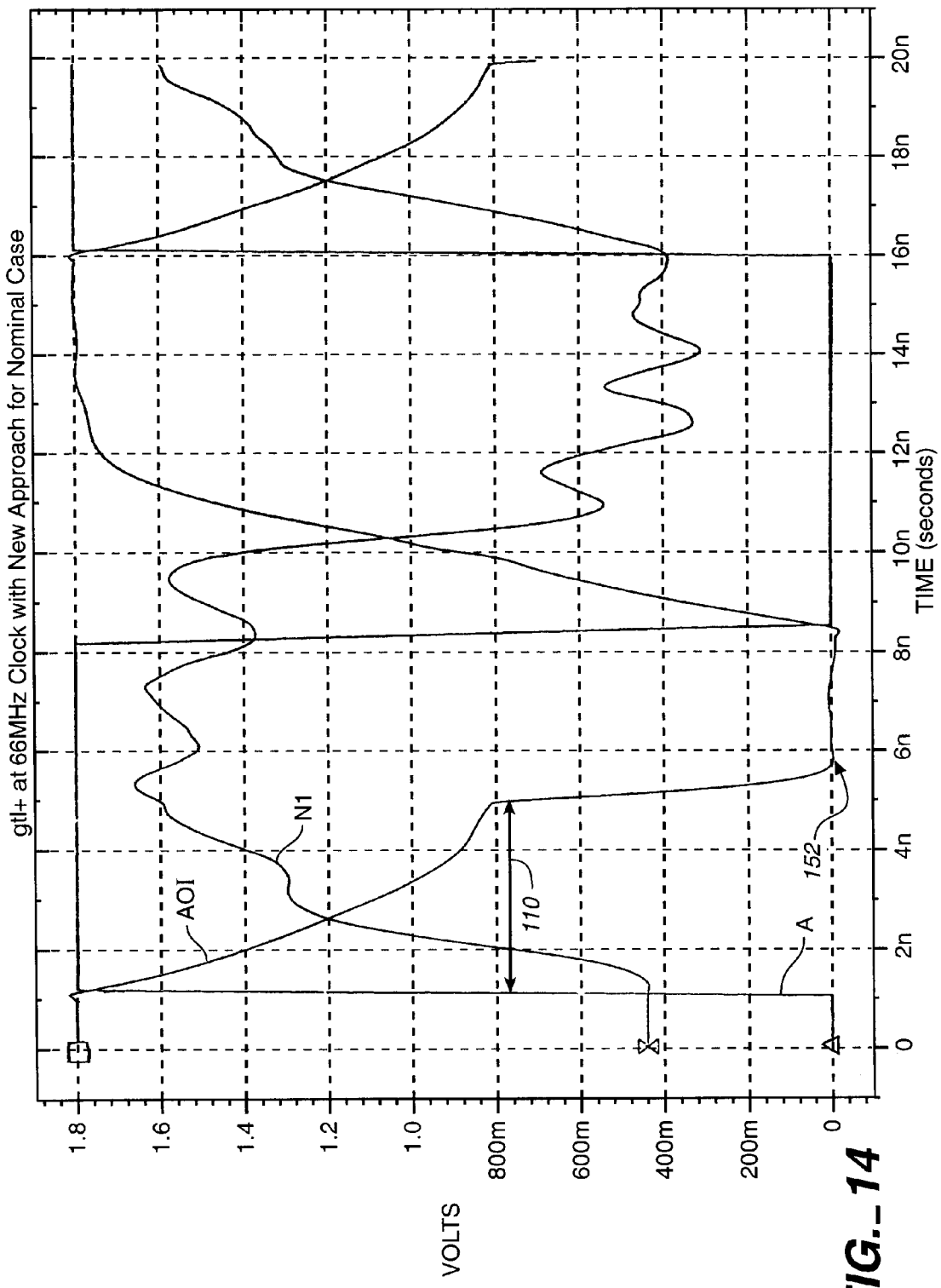
FIG._14

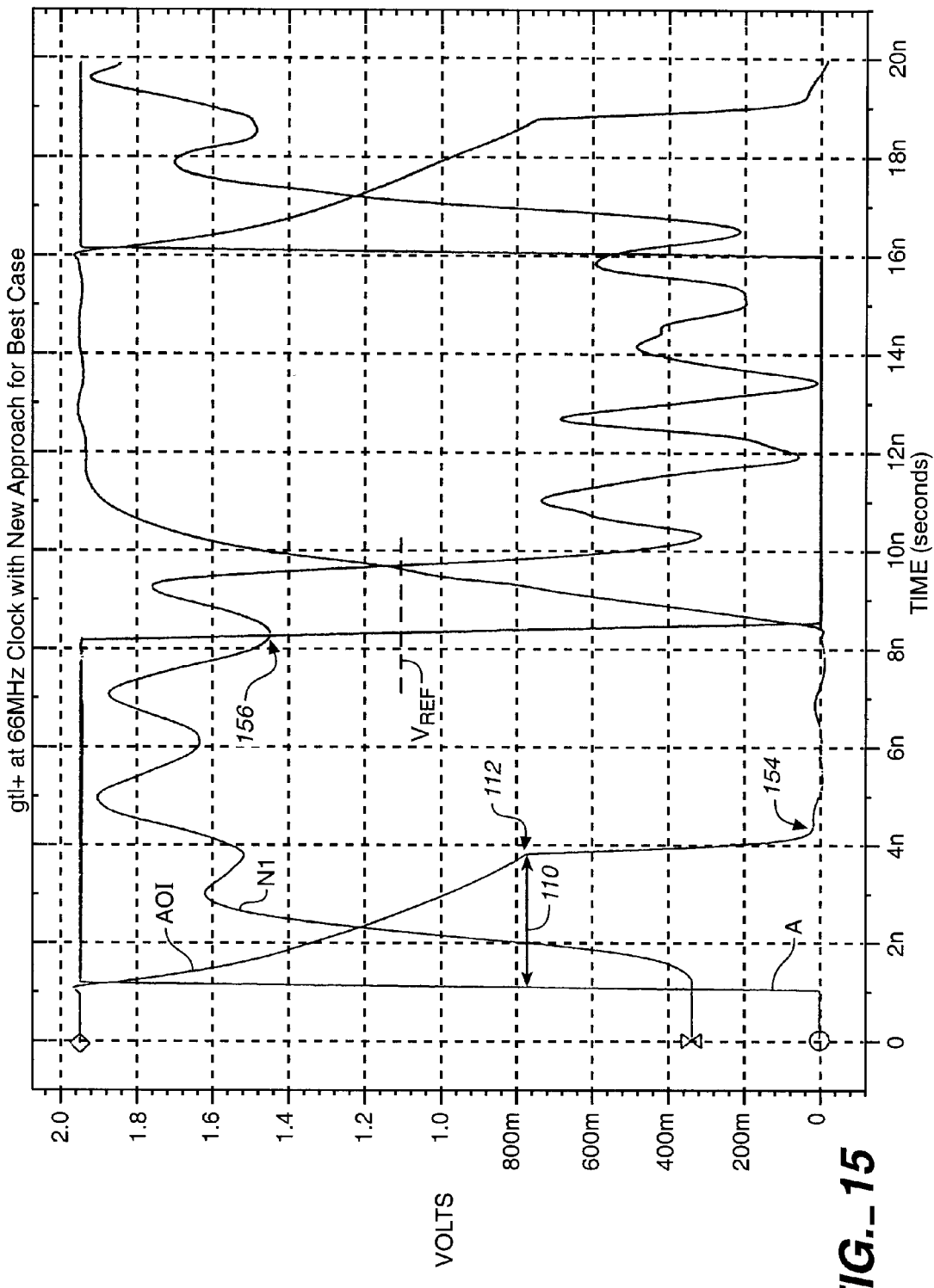
FIG._15

PREDRIVER FOR HIGH FREQUENCY DATA TRANSCEIVER

BACKGROUND OF THE INVENTION

The present invention relates to high performance data transceivers and, more particularly, to a predriver for driving the input of a high speed output driver.

Data transceivers are used in a variety of computer systems and communication networks for transmitting data between various components of the system. As data throughput requirements continue to increase, data transmission frequencies continue to increase. For example, output drivers having a low output voltage swing, such as Gunning Transceiver Logic (GTL/GTL+) drivers, have been developed for driving high performance processor system buses and computer system backplanes. A basic GTL+ output driver includes a low impedance open drain N-channel metal oxide semiconductor (NMOS) transistor, which drives the receivers attached to the system bus through an incident wave switching interface. The NMOS driver transistor drives the incident wave with sufficient amplitude to switch the logic states of the receivers. External pull-up resistors are used to terminate the system bus transmission lines and to provide a pull-up current path when the NMOS driver transistor is off.

A predriver circuit is typically used to drive the input to the NMOS driver transistor at a high frequency. A traditional GTL+ predriver circuit is configured as a logic NOR gate, with additional circuitry to speed the rise and fall times of the predriver output. At high frequencies, it is difficult for the predriver output to maintain an full "rail-to-rail" voltage swing. In particular, it is difficult for the predriver to drive its output completely to zero volts before the output is charged back up again with the next data transition. At higher frequencies, the low voltage output of the predriver can rise close to the threshold voltage of NMOS driver transistor. The NMOS driver transistor may not turn off completely, which can result in undesirable leakage current through the transistor or unintended switching at the receivers. If the predriver output discharges more quickly, thus reaching a lower voltage, the faster discharge can cause greater overshoots and ringbacks at high frequencies.

Improved predrivers which are capable of driving an output voltage rail-to-rail within the desired frequency while controlling overshoots and ringback are desired.

SUMMARY OF THE INVENTION

One aspect of the present invention relates to a predriver for driving an output data buffer at high frequencies. The predriver includes a data input, a data output, a first voltage pull-up circuit, a first voltage pull-down circuit, a delay circuit and a second voltage pull-down circuit. The first voltage pull-up circuit is coupled to the data output and has a control terminal coupled to the data input. The first voltage pull-down circuit is coupled to the data output and has a control terminal coupled to the data input. The first voltage pull-down circuit, when active, is adapted to at least temporarily hold the data output above a selected voltage. The delay circuit is coupled to the data input. The second voltage pull-down circuit is coupled to the data output and has a control terminal coupled to an output of the delay circuit.

Another aspect of the present invention relates to a data transmission apparatus, which includes a transmission line, a termination resistance and an output driver. The termination resistance and the output driver are coupled to the transmission line. The predriver includes a data input for receiving a data transition and a data output, which is coupled to the output driver. The predriver partially discharges the data output from a logic high level to a logic low level in response to the data transition received on the data input. The predriver then further discharges the data output after a time delay measured from the data transition.

Yet another aspect of the present invention relates to a method of driving an output driver input at high frequencies in a data transmission system. The method includes receiving a data signal having a first transition from a first logic state to a second, different logic state. The output driver input is partially discharged in response to the first transition. The output driver input is then further discharged in response to the first transition, after waiting a time delay measured from the first transition.

BRIEF DESCRIPTION OF THE DRAWINGS

FIG. 1 is a diagram of a high frequency data transmission system according to one embodiment of the present invention.

FIG. 2 is a schematic diagram of a predriver in the data transmission system shown in FIG. 1, according to one embodiment of the present invention.

FIG. 3 is a schematic diagram of a typical predriver of the prior art.

FIG. 4 is a graph illustrating the operation of the predriver shown in FIG. 3 at 33 MHz for a worst case process, voltage and temperature condition.

FIG. 5 is a graph illustrating the predriver of FIG. 3 operated at 33 MHz for a nominal case condition.

FIG. 6 is a graph illustrating the predriver of FIG. 3 operated at 33 MHz for a best case condition.

FIG. 7 is a graph illustrating the predriver of FIG. 2 operated at 33 MHz for a worst case condition.

FIG. 8 is a graph illustrating the predriver of FIG. 2 operated at 33 MHz for a nominal case condition.

FIG. 9 is a graph illustrating the predriver of FIG. 2 operated at 33 MHz for a best case condition FIG. 10 is a graph illustrating the predriver of FIG. 3 operated at 66 MHz for a worst case condition.

FIG. 11 is a graph illustrating the predriver of FIG. 3 operated at 66 MHz for a nominal case condition.

FIG. 12 is a graph illustrating the predriver of FIG. 3 operated at 66 MHz for a best case condition.

FIG. 13 is a graph illustrating the predriver of FIG. 2 operated at 66 MHz for a worst case condition.

FIG. 14 is a graph illustrating the predriver of FIG. 2 operated at 66 MHz for a nominal case condition.

FIG. 15 is a graph illustrating the predriver of FIG. 2 operated at 66 MHz for a best case condition.

DETAILED DESCRIPTION OF ILLUSTRATIVE EMBODIMENTS

FIG. 1 is a diagram of a high frequency data transmission system according to an illustrative embodiment of the present invention. System 10 includes predriver 12, output driver 14, transmission line 16, termination resistances $R_{T1}$ and $R_{T2}$ and receivers $18_0$–$18_N$. System 10 can further include additional drivers 14 (not shown), which drive transmission line 16. The elements $R_p$, $L_p$ and $C_p$ represent the resistance, inductance and capacitance, respectively, of the integrated circuit package in which predriver 12 and driver 14 are mounted.

Predriver 12 has a data input A and a data output AOI. Data output AOI is coupled to the input of driver 14. The output of driver 14 is coupled to node N1 on transmission line 16. Termination resistance $R_{T1}$ is coupled between one end of transmission line 16 and a termination voltage supply terminal $V_{TT}$. Termination resistance $R_{T2}$ is coupled between the other end of transmission line 16 and termination voltage supply terminal $V_{TT}$. In one embodiment, termination voltage supply terminal $V_{TT}$ is tied to 1.5 volts, for example.

Data transmission system 10 can be configured to implement various high speed electrical bus specifications, such as the specifications for Gunning Transceiver Logic (GTL/GTL+). Other specifications can also be used. A traditional GTL+ predriver is configured as a logic NOR gate with additional circuitry to speed the rise and fall times of the predriver output AOI. One of the inputs to the NOR gate is used as data input A, and one or more additional inputs (not shown) are used as enable inputs. The output from the NOR gate drives data output AOI. Other types of predriver circuits can also be used for predriver 12.

Driver 14 receives the data signal from input AOI and drives transmission line 16 at node N1. A basic GTL+ output driver includes a low-impedance, open-drain driver transistor, such as an N-channel metal oxide semiconductor (NMOS) transistor, for driving transmission line 16 through an incident wave switching interface. However, other types of output drivers can also be used for output driver 14. The NMOS driver transistor drives node N1 with sufficient amplitude to switch the logic states of receivers $18_0$–$18_N$. In one embodiment, driver 14 drives transmission line 16 with a low output voltage swing, such as about 200 millivolts to $V_{TT}$. Termination resistors $R_{T1}$ and $R_{T2}$ terminate transmission line 16 and also provide a pull-up current path when the NMOS driver transistor in output driver 14 is off.

Receivers $18_0$–$18_N$ each include a differential amplifier, which has one differential input coupled to transmission line 16 and another differential input coupled to a reference voltage. In one embodiment, the reference voltage is set to a nominal 1.0 volts, which can vary from about 0.9 volts to about 1.1 volts under various process and operating conditions. Signals above the reference voltage are interpreted by receivers $18_0$–$18_N$ as being at a logic high level and signals below the reference voltage are interpreted by receivers $18_0$–$18_N$ as being at a logic low level. Other receiver circuit configurations can also be used in alternative embodiments.

At high data frequencies, it is difficult for traditional predriver circuits to drive the input to driver 14 with the entire "rail-to-rail" voltage swing. In particular, it is difficult for traditional predrivers to discharge output AOI completely to zero within one clock cycle. At higher frequencies the low voltage output of a traditional predriver can come close to or above the threshold voltage of the NMOS driver transistor in driver 14. This threshold voltage can be about 0.5 volts to about 0.6 volts, for example, depending on the technology used. The NMOS driver transistor may therefore not turn off completely, which can result in undesirable leakage current through the transistor or unintended switching at receivers $18_0$–$18_N$. If a traditional predriver is sped up to discharge output AOI more quickly, this may cause undesired overshoots and ringbacks at node N1, which can also result in undesired switching by receivers $18_0$–$18_N$.

FIG. 2 is a schematic diagram of predriver 12 according to one embodiment of the present invention, which is capable of driving output AOI substantially to zero at high data frequencies while reducing overshoots and ringbacks. Predriver 12 includes data input A, enable input EN, hot insertion enable input HEN and data output AOI. Predriver 12 further includes N-channel metal oxide semiconductor (MOS) transistors MN1A–MN1D, MN4, MNCLAMPA, MNCLAMPE, MNDELAYA, MNCUTOFFA, MNDELAYE and MNCUTOFFE, p-channel MOS transistors MP1A–MP1C, MP4 and MP7–MP9 and delay circuits 40 and 42.

The basic logical function of predriver 12 is an NOR gate formed by transistors MN1A–MN1C and MP1A–MP1C. Transistors MP1A–MP1C are coupled together in series between voltage supply terminal VDD and output terminal AOI and have gates or "control terminals" coupled to inputs A, EN and HEN, respectively. Transistors MP1A–MP1C together form a pull-up circuit for charging output AOI toward the voltage on supply terminal VDD when all of the transistors MP1A–MP1C are on. Transistors, MN1A–MN1C are coupled together in parallel between output AOI and voltage supply terminal VSS. The gates of transistors MN1A–MN1C are coupled to inputs A, EN and HEN, respectively. Transistors MN1A–MN1C together form a pull-down circuit for discharging output AOI toward the voltage on supply terminal VSS when any one of the transistors MN1A–MN1C are on.

When both enable inputs EN and HEN are low (i.e., a logic "0" state), transistors MP1B and MP1C are on, and transistors MN1B and MN1C are off. Output AOI follows the inverse of input A. If data input A is low, transistor MP1A is on, transistor MN1A is off and output AOI charges toward voltage supply terminal VDD through transistors MP1A, MP1B and MP1C. If data input A is high, transistor MP1A is off and transistor MN1A is on such that output terminal AOI discharges toward voltage supply terminal VSS through transistors MNCLAMPA, MN1A and MN1D. If any one of the enable inputs EN or HEN are high, its respective P-channel transistor MPLB or MP1C will be off, and its respective N-channel transistor MN1B or MN1C will be on, thereby discharging output AOI irrespective of the data on input A.

In an alternative embodiment, enable inputs EN and HEN are removed along with the respective transistors MP1B, MP1C, MN1B, MN1C, MNCLAMPE, MNDELAYE, MNCUTOFFE and delay circuit 40. In this embodiment, transistors MP1A and MN1A together form an inverter, which is coupled between data input A and data output AOI.

In the embodiment shown in FIG. 2, the remaining elements in predriver 12 assist in improving the performance of the predriver at high data frequencies. Transistor MN1D has a gate coupled to voltage supply terminal VDD, a drain coupled to the sources of transistors MN1A and MN1B and a source coupled to voltage supply terminal VSS. Transistor MN1D is always on and has a longer channel than transistor MN1A. The long channel length of transistor MN1D serves to slow down the discharge of output AOI when data input A transitions from low to high. This assists in reducing reflections on output AOI. Transistor MN1D also controls the slew rate on output AOI to smoothen transition edges.

Transistor MNCLAMPA is coupled in series with pull-down transistor MN1A, with the gate and drain of transistor MNCLAMPA being coupled to output AOI and the source of transistor MNCLAMPA being coupled to the drain of transistor MN1A. Transistor MNCLAMPA is essentially coupled as a diode in the current path from output AOI to supply terminal VSS, through transistor MN1A. Since the gate of transistor MNCLAMPA is coupled to output terminal AOI, transistor MNCLAMPA operates as a holding transistor which holds output terminal AOI above the gate-source threshold voltage of transistor MNCLAMPA when output AOI discharges from a high state to a low state.

Assuming EN and HEN are both low, as data input A transitions from low to high, transistor MP1A slowly turns off, while transistor MN1A turns on. Transistor MN1A discharges output AOI until output AOI reaches the gate-source threshold voltage of holding transistor MNCLAMPA. At this point, holding transistor MNCLAMPA begins to shut off, thereby clamping the voltage at output AOI. The partial discharge of output AOI is enough to cause the NMOS driver transistor in driver 14 (shown in FIG. 1) to drive node N1 (also shown in FIG. 1) to its high voltage level, but not great enough to cause unacceptably high overshoots and ringbacks on node N1.

Delay circuit 42, transistors MNDELAYA and MNCUT-OFFA form a delayed pull-down circuit 44, which further discharges output AOI after a selected time delay determined by delay circuit 42. Delay circuit 42 is coupled between data input A and the gate of delayed pull-down transistor MNDELAYA. The source of transistor MNDELAYA is coupled to supply terminal VSS, and the drain of transistor MNDELAYA is coupled to the source of cut-off transistor MNCUTOFFA. Cut-off transistor MNCUTOFFA has a gate coupled to data input A, which bypasses delay circuit 42, and a drain coupled to output AOI.

The time delay provided by delay circuit 42 is selected such that, following a low-to-high transition at data input A, a large portion of the energy at output AOI has dissipated through MNCLAMPA, MN1A and MN1D before transistor MNDELAYA turns on. In one embodiment, the time delay is approximately 4–5 nanoseconds. However, any time delay can be used, depending upon the data frequency, as long as output AOI is held close to the clamping voltage of MNCLAMPA briefly before delay circuit 42 turns on MNDELAYA. Once a portion of the energy has been discharged from output AOI, delayed pull-down circuit 44 can then quickly discharge the remaining energy on output AOI without causing unacceptably high overshoots and ringbacks at node N1 (shown in FIG. 1). In one embodiment, transistor MNDELAYA has a shorter channel transistors MN1D and MNCLAMPA. Other relative channel lengths can also be used.

When data input A transitions back to the logic low level, transistor MP1A begins to turn on and cut-off transistor MNCUTOFFA quickly turns off to prevent a short to voltage supply terminal VSS through transistor MNDELAYA, which is still on due to delay circuit 42. Cut-off transistor MNCUTOFFA bypasses delay circuit 42.

Predriver 12 further includes a voltage holding transistor MNCLAMPE for temporarily holding output AOI above the gate-source threshold voltage of the transistor when enable input EN transitions from low to high and pull-down transistor MN1B begins to turn on. Holding transistor MNCLAMPE has a gate and drain coupled to output AOI and a source coupled to the drain of pull-down transistor MN1B. Holding transistor MNCLAMPE operates substantially the same as holding transistor MNCLAMPA.

Predriver circuit 12 further includes another delayed, pull-down circuit 46, which includes delay transistor MNDELAYE, cut-off transistor MNCUTOFFE and delay circuit 40. Delayed, pull-down circuit 46 operates substantially the same as delayed, pull-down circuit 44, but is controlled by enable input EN. When data input transitions to a high level, delay circuit 40 delays the turn on of delayed pull-down transistor MNDELAYE until a portion of the energy on output AOI has already dissipated through MNCLAMPE, MN1B and MN1D. After the selected time delay determined by delay circuit 40, MNDELAYE discharges the remaining charge on output AOI.

Pull-up circuit 48 helps to bring the voltage on output AOI up faster when data input A transitions from high to low. Pull-up circuit 48 includes transistors MN4, MP4, MP7, MP8 and MP9. Transistors MN4 and MP4 are coupled together to form an inverter, between output AOI and the gate of transistor MP9. Transistors MP7, MP8 and MP9 are coupled together in series between voltage supply terminal VDD and data output AOI. The gate of transistor MP7 is coupled to enable input EN, and the gate of transistor MP8 is coupled to data input A. Transistor MP7 is on when enabled by enable input EN. When data input A transitions to a low level, transistor MP8 turns on. As output AOI goes high, the output of inverter 49 goes low and turns on transistor MP9, providing an additional current path for charging output AOI.

FIG. 3 is a diagram of a typical GTL+ predriver 50 of the prior art, which has difficulty pulling output AOI completely to zero at high data frequencies and causes significant overshoots and ringbacks at transmission node N1 (shown in FIG. 1). The same reference numerals and element designations are used in FIG. 3 as were used in FIG. 2 for the same or similar elements. Transistors MP1A, MP1B, MP1C MN1A, MN1B and MN1C are coupled together to form a NOR gate between inputs A, EN and HEN and output AOI, similar to the embodiment shown in FIG. 2. However, the pull-down portion of the NOR gate does not include holding transistors MNCLAMPA and MNCLAMPE. Predriver 50 further lacks delayed, pull-down circuits 44 and 46. Instead, predriver 50 includes a pull-down circuit 52, formed by N-channel transistor MN3, P-channel transistor MP3 and P-channel transistor MP6. Transistors MN3 and MP3 are coupled together to form an inverter 54 having an input coupled to data input A and an output coupled to the gate of transistor MP6. Transistor MP6 has a drain coupled to data output AOI and a source coupled to voltage supply terminal VSS.

When data input A transitions from a low to high level, transistor MP1A turns off, and transistor MN1A turns on, slowly pulling data output AOI low. P-channel transistor MP6 also turns on, assisting in the discharge of data output AOI. However, it has been found that predriver 50 either discharges data output AOI too quickly, which causes unacceptable overshoots and ringbacks at the output, or does not pull data output AOI completely to zero at high data frequencies.

The performance of predrivers 12 and 50 were compared and plotted in the graphs shown in FIGS. 4–15. In these figures, the voltages on data input A, data output AOI and transmission node N1 were plotted as a function of time for various data frequencies at worst case, nominal case and best case process conditions. The worst case, nominal case and best case examples take into account changes in process conditions, operating temperature, and voltage levels.

Looking at FIG. 4, this figure shows predriver 50 operating a 33 megahertz (MHz) for the worst case condition. Data input A transitions from zero volts to a little over 1.6 volts at one nanosecond and transitions back to zero volts at 16 nanoseconds. At one nanosecond, data output AOI begins to discharge slowly and reaches only about 200 millivolts, as shown by arrow 100, before being charged up again by the next transition on data input A. Data output AOI is not fully discharged to zero volts. Although 200 millivolts is less than the threshold voltage of the NMOS driver in output driver 14

(shown in FIG. 1), it may be close enough to the threshold voltage to cause leakage current through the driver transistor if the driver transistor remains partially on.

FIG. 5 shows predriver 50 operating a 33 megahertz for the nominal case. In this case, data output AOI drops more quickly, after data input A transitions high at 1 nanosecond, and substantially reaches zero volts before data input A transitions low again at 16 nanoseconds. However, the magnitude of the overshoots and ringbacks at transmission node N1, shown at 102, is increased as compared to the worst case due to the faster discharge of output AOI. FIG. 6 shows predriver 50 operating at 33 megahertz for the best case. Again, output AOI discharges relatively quickly, beginning at one nanosecond and the overshoots and ringbacks at 104 become larger, but remain within an acceptable range. Although predriver 50 can be modified to discharge output AOI more quickly such that AOI completely reaches zero volts for the worst case (shown in FIG. 4), this would further increase the ringing at node N1 for the best case, which may rise to an unacceptable level.

FIG. 7 shows predriver 12 of the present invention operating at 33 megahertz for the worst case. As data input A transitions from zero volts to about 1.6 volts at one nanosecond, data output AOI begins to discharge through holding transistor MNCLAMPA (shown in FIG. 2) and pull-down transistor MN1A. Holding transistor MNCLAMPA holds output AOI above its threshold voltage (about 570 millivolts) until delayed pull-down transistor MNDELAYA turns on at about 9 nanoseconds, which was delayed by a time delay 110 from the transition in data input A. The length of time delay 110 is determined by delay circuit 42. Delayed pull-down transistor MNDELAYA then quickly discharges output AOI substantially to zero volts. Due to time delay 110, a substantial amount of the energy at output AOI is dissipated by the time transistor MNDELAYA brings output AOI completely to zero. This significantly reduces the magnitude of the overshoots and ringbacks at transmission node N1, as shown at 114, that would otherwise be caused by bringing AOI completely to zero.

FIG. 8 shows predriver 12 operated a 33 megahertz for the nominal case. Again, holding transistor MNCLAMPA clamps output AOI above its threshold voltage until transistor MNDELAYA turns on, after time delay 110, and brings output AOI substantially to zero volts. The amplitude of the overshoots and ringbacks are larger for the nominal case, but are still within an acceptable range. For example, the GTL+ transmission line reference voltage $V_{REF}$ is about 1.0 volts for the nominal case. The largest amplitude ringback on node N1, shown by arrow 120, remains sufficiently above $V_{REF}$ such that the ringbacks do not cause unintended switching by the receivers coupled to the transmission line.

FIG. 9 shows predriver 12 operated at 33 megahertz for the best case. Again, delay transistor MNDELAYA pulls output AOI completely to zero. The overshoots and ringbacks on node N1, shown by arrow at 114, remain sufficiently above the reference voltage $V_{REF}$, which is about 1.1 volts for the best case.

FIG. 10 shows predriver 50 being operated at 66 megahertz for the worst case. Predriver 50 is now only capable of pulling AOI down to about 500 millivolts, as shown by arrow 130, before AOI is charged again with the next transition in data in A. This is very close to the 0.5–0.6 volt threshold voltage $V_{TH}$ of the NMOS driver transistor in driver circuit 14 (shown in FIG. 1). There is now a significant risk that the driver transistor will remain on or partially on when AOI is at its lowest voltage. This can cause undesirable leakage current through the driver transistor and can cause loss of data. Any attempt to modify predriver 50 to pull AOI down more quickly will negatively effect the overshoot at ringback at node N1 for the best case shown in FIG. 12.

FIG. 11 shows predriver 50 operated at 66 megahertz for the nominal case. FIG. 12 shows predriver 50 operated at 66 megahertz for the best case. Although AOI discharges substantially to zero volts for the best case at about 6 nanoseconds, the overshoots and ringback on transmission node N1 are unacceptably high. For example, at arrow 140, the voltage on node N1 drops to about 1.2 volts. This is only 0.1 volt above the 1.1 volt reference voltage $V_{REF}$ for the best case. As a result, such ringbacks can cause unintended switching of the receivers coupled to the transmission line. In one embodiment, it is desired to keep ringbacks on node N1 at least 200 millivolts away from the reference voltage level $V_{REF}$.

FIG. 13 shows predriver 12 of the present invention operated at 66 megahertz for the worst case. Once again, delay transistor MNDELAYA pulls output AOI substantially to zero, as shown by arrow 150, after time delay 110. This prevents any leakage current through the NMOS driver transistor in driver 110 (shown in FIG. 1) FIG. 14 shows predriver 12 operated at 66 megahertz for the nominal case. Once again, delay transistor MNDELAYA pulls output AOI to zero volts, as shown by arrow 152, following time delay 110.

FIG. 15 shows predriver 12 operated at 66 megahertz for the best case. Again, delay transistor MNDELAYA pulls output AOI substantially to zero volts at arrow 154, following time delay 110. In addition, the highest magnitude ringback, shown at arrow 156, on node N1 remains sufficiently above the 1.1 volt reference voltage $V_{REF}$ to avoid any unintended switching of the receivers. In the embodiment shown in FIG. 15, the ringback at arrow 156 remains at least 300 millivolts away from $V_{REF}$.

Predriver 12 is therefore capable of driving the input of driver 14 (shown in FIG. 1) across the full rail-to-rail voltage swing at high frequencies with a minimum amount of overshoot and ringback. Predriver 12 can be used in a wide variety of high speed data transmission systems, such as systems using GTL/GTL+ technology, for example.

Although the present invention has been described with reference to preferred embodiments, workers skilled in the art will recognize that changes may be made in form and detail without departing from the spirit and scope of the invention. For example, the present invention can be implemented with various technologies in addition to CMOS. Various circuit alternative configurations can be used. The transistors shown in the figures can include individual transistors or an array of transistors coupled together in parallel with one another. The voltage supply terminals can be relatively positive or relatively negative depending upon the particular convention adopted and the technology used and can include a power supply bus or a biased reference terminal having a voltage other than that of the power supply bus, for example. The terms "high" and "low" used in the specification and the claims are arbitrary terms and are interchangeable with a logical inversion of the circuit. Likewise, the term "coupled" can include various types of connections or couplings and can include a direct connection or a connection through one or more intermediate components.

What is claimed is:

1. A predriver for driving an output data buffer at high frequencies, the predriver comprising:

a data input;

a data output;

a first voltage pull-up circuit coupled to the data output for pulling the data output toward a first voltage and having a control terminal coupled to the data input;

a first voltage pull-down circuit coupled to the data output for pulling the data output toward a second voltage, which is lower than the first voltage, and having a control terminal coupled to the data input, wherein the first voltage pull-down circuit, when active, is adapted to hold the data output above a selected voltage, which is greater than the second voltage, for at least a time period;

a delay circuit coupled to the data input and having a time delay from the data input to an output of the delay circuit, which is at least as great as the time period; and a second voltage pull-down circuit coupled to the data output and having a control terminal coupled to an the output of the delay circuit.

2. The predriver of claim 1 wherein the first voltage pull-down circuit comprises:

a first pull-down transistor having a control terminal coupled to the data input; and an output voltage holding transistor coupled in series between the data output and the pull-down transistor such that the output holding transistor and the pull-down transistor form a pull-down current path for the data output.

3. The predriver of claim 2 wherein the output holding transistor is coupled as a diode, with a gate and drain of the output holding transistor being coupled to the data output and a source of the output holding transistor being coupled to the first pull-down transistor.

4. The predriver of claim 2 wherein the second voltage pull-down circuit comprises:

a second pull-down transistor having a control terminal coupled to the output of the delay circuit and having a channel length that is shorter than a channel length of the output holding transistor.

5. The predriver of claim 1 and further comprising first and second supply terminals, wherein:

the first voltage pull-up circuit comprises a P-channel transistor having a source coupled to the first supply terminal, a drain coupled to the data output and a gate coupled to the data input;

the first voltage pull-down circuit comprises: an N-channel holding transistor having a gate and drain, which are coupled to the data output, and a source; and a first N-channel pull-down transistor having a gate coupled to the data input, a drain coupled to the source of the N-channel holding transistor and a source coupled to the second supply terminal.

6. The predriver of claim 5 wherein the first voltage pull-down circuit further comprises:

a second N-channel transistor coupled in series with the N-channel holding transistor and the N-channel pull-down transistor and having a source coupled to the second supply terminal, a drain coupled to the source of the first N-channel pull-down transistor and a gate coupled to the first voltage supply terminal.

7. The predriver of claim 1 and further comprising first and second supply terminals, wherein the second voltage pull-down circuit comprises:

an N-channel pull-down transistor having a gate coupled to the output of the delay circuit, a source coupled to the second supply terminal and a drain; and an N-channel cut-off transistor having a gate coupled to the data input, which bypasses the delay circuit, a source coupled to the drain of the N-channel pull-down transistor and a drain coupled to the data output.

8. A data transmission apparatus comprising:

a transmission line;

a termination resistance coupled to the transmission line;

an output driver coupled to the transmission line; and a predriver comprising:

a data input for receiving a data transition;

a data output coupled to the output driver;

means for partially discharging the data output from a first voltage while holding the output data input above a second voltage, which is lower than the first voltage, in response to a data transition received on the data input; and means for further discharging the data output toward a third voltage, which is lower than the second voltage, after a time delay measured from the data transition.

9. The data transmission apparatus of claim 8 wherein the predriver further comprises first and second supply terminals and wherein the means for partially discharging comprises:

an N-channel voltage holding transistor having a gate and drain, which are coupled to the data output, and having a source; and an N-channel pull-down transistor having a gate coupled to the data input, a drain coupled to the source of the holding transistor and a source coupled to the second supply terminal, thereby forming a discharge current path from the data output to the second supply terminal through the holding transistor and the pull-down transistor.

10. The data transmission apparatus of claim 9 wherein the means for discharging further comprises:

an additional N-channel transistor coupled in the discharge current path and having a source coupled to the second supply terminal, a drain coupled to the source of the pull-down transistor and a gate coupled to the first voltage supply terminal.

11. The data transmission apparatus of claim 8 wherein the means for further discharging comprises:

a delay circuit comprising an input, which is coupled to the data input, and an output, wherein the delay circuit provides the time delay; and a delayed, pull-down transistor coupled to the data output and having a control terminal coupled to the output of the delay circuit.

12. The data transmission apparatus of claim 11 wherein the means for further discharging comprises:

a cut-off transistor coupled between the data output and the delayed, pull-down transistor and having a control terminal coupled to the data input, which bypasses the delay circuit.

13. The data transmission apparatus of claim 8 wherein the predriver further comprises:

means for charging the data output in response to a further data transition received on the data input, which is opposite to the first mentioned data transition.

14. The data transmission apparatus of claim 13 wherein the means for partially discharging and the means for charging together form an inverter between the data input and the data output.

15. A method of driving an output driver input at high frequencies in a data transmission system, the method comprising:

(a) receiving a data signal having a first transition from a first logic state to a second, different logic state;

(b) partially discharging the output driver input from a first voltage while holding the output data input above a second voltage, which is lower than the first voltage, in response to the first transition; and (c) further discharging the output driver input toward a third voltage, which is lower than the second voltage, after step (b) in response to the first transition, after waiting a time delay measured from the first transition.

16. The method of claim 15 wherein the data signal received in step (a) has a second transition from the second logic state to the first logic state and wherein the method further comprises:

(d) charging the output driver input in response to the second transition; and (e) terminating step (c) in response to the second transition, with substantially no time delay from the second transition.

\* \* \* \* \*